(12) United States Patent
Sasaki et al.

(10) Patent No.: US 8,395,961 B2
(45) Date of Patent: Mar. 12, 2013

(54) SEMICONDUCTOR MEMORY DEVICE

(75) Inventors: Hirotoshi Sasaki, Kawasaki (JP);
Yukitoshi Hanafusa, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 255 days.

(21) Appl. No.: 12/795,928

(22) Filed: Jun. 8, 2010

(65) Prior Publication Data

US 2010/0329068 A1 Dec. 30, 2010

(30) Foreign Application Priority Data

Jun. 25, 2009 (JP) ................................. 2009-151430

(51) Int. Cl.
*G11C 8/00* (2006.01)

(52) U.S. Cl. ................ 365/230.06; 365/63; 365/189.08; 365/72; 365/156

(58) Field of Classification Search ............. 365/230.06, 365/63, 156, 72, 189.08
See application file for complete search history.

(56) References Cited

U.S. PATENT DOCUMENTS

| | | | | | |
|---|---|---|---|---|---|
| 4,638,466 | A | * | 1/1987 | Fukumoto | 365/94 |
| 4,796,234 | A | * | 1/1989 | Itoh et al. | 365/149 |
| 5,673,230 | A | * | 9/1997 | Kuriyama | 365/203 |
| 5,826,056 | A | | 10/1998 | Noda | |
| 5,986,924 | A | * | 11/1999 | Yamada | 365/154 |
| 6,061,267 | A | * | 5/2000 | Houston | 365/154 |
| 6,421,297 | B1 | * | 7/2002 | Huber | 365/230.06 |
| 6,452,858 | B1 | * | 9/2002 | Hanzawa et al. | 365/230.06 |
| 6,751,154 | B2 | * | 6/2004 | Kuroda | 365/230.06 |
| 6,894,923 | B2 | * | 5/2005 | Inaba | 365/158 |
| 7,400,523 | B2 | * | 7/2008 | Houston | 365/154 |
| 7,764,535 | B2 | * | 7/2010 | Nguyen | 365/154 |
| 7,881,147 | B2 | * | 2/2011 | Chen et al. | 365/233.1 |
| 7,986,547 | B2 | * | 7/2011 | Hirabayashi | 365/156 |

FOREIGN PATENT DOCUMENTS

| | | |
|---|---|---|
| JP | 4-11388 | 1/1992 |
| JP | 5-175461 | 7/1993 |
| JP | 5-218354 | 8/1993 |
| JP | 6-295588 | 10/1994 |
| JP | 10-40685 | 2/1998 |
| JP | 2006-269023 | 10/2006 |

OTHER PUBLICATIONS

Japanese Patent Office Notification of Reason for Refusal mailed Jan. 15, 2013 for corresponding Japanese Patent Application No. 2009-151430.

* cited by examiner

*Primary Examiner* — Viet Q Nguyen

(74) *Attorney, Agent, or Firm* — Staas & Halsey LLP

(57) ABSTRACT

A semiconductor memory device includes a plurality of memory cells, a plurality of bit lines respectively connected to the memory cells, a plurality of first and second word lines respectively connected to the memory cells, a plurality of first drivers for driving the first word lines selected during a read operation, and a plurality of second drivers for driving the second word lines selected during a write operation, the second driver having a different drive capability from the first driver's.

9 Claims, 14 Drawing Sheets

SEMICONDUCTOR MEMORY DEVICE

CROSS-REFERENCE TO RELATED APPLICATION

This application is based upon and claims the benefit of priority of the prior Japanese Patent Application No. 2009-151430 filed on Jun. 25, 2009, the entire contents of which are incorporated herein by reference.

FIELD

The embodiments discussed herein are related to a semiconductor memory device.

BACKGROUND

Examples of a memory embedded in a large scale integrated circuit (LSI) include a semiconductor memory device such as a static random access memory (SRAM). Examples of an SRAM includes a 1-read 1-write (1R1W)-SRAM, a 2-read 1-write (2R1W)-SRAM, and so forth in terms of configuration of a read port and a write port.

FIG. 1 is a diagram illustrating a configuration of an example of a 2R1W-SRAM. In FIG. 1, BL_0L, BL_0R, BL_1L, and BL_1R denote bit lines. In FIG. 1, WL_0L, WL_0R, W_1L, and W_1R denote word lines. In FIGS. 1, 1-00, 1-01, 1-10, and 1-11 (MC00, MC01, MC10, and MC11) denote memory cells that are provided in a memory cell array 1. In FIG. 1, 2-0L, 2-0R, 2-1L, and 2-1R are word line drivers that drive the word lines WL_0L, WL_0R, W_1L, and W_1R, respectively. In FIG. 1, only the four memory cells 1-00, 1-01, 1-10, and 1-11 provided in the memory cell array 1 are illustrated for simplicity of description. Two word lines WL_xL and WL_xR and two bit lines BL_xL and BL_xR are connected to each memory cell MC. For example, the two word lines WL_0L and WL_0R and the two bit lines BL_0L and BL_0R are connected to the memory cell 1-00. The word line drivers 2-0L, 2-0R, 2-1L, and 2-1R have the same configuration and the same occupied area.

FIG. 2 is a diagram illustrating a configuration of the memory cell 1-00 illustrated in FIG. 1. In FIG. 2, Vdd denotes a power-supply voltage, and Vss denotes the ground voltage. The other memory cells 1-01, 1-10, and 1-11 have the same configuration of the memory cell 1-00. The memory cell 1-00 has six transistors Tr1 to Tr6.

FIG. 3 is a diagram illustrating a configuration of an example of a 1R1W-SRAM. In FIG. 3, BL_0L, BL_0R, B_1L, and BL_1R denote bit lines. In FIG. 3, WL_0 and W_1 denote word lines. In FIGS. 3, 11-00, 11-01, 11-10, and 11-11 (MC00, MC01, MC10, and MC11) denote memory cells that are provided in a memory-cell array 11. In FIGS. 3, 12-0 and 12-1 are word line drivers that drive the word lines WL_0 and WL_1, respectively. In FIG. 3, only the four memory cells 11-00, 11-01, 11-10, and 11-11 provided in the memory-cell array 11 are illustrated for simplicity of description. One word line WL_x and two bit lines BL_xL and BL_xR are connected to each memory cell MC. For example, the one word lines WL_0 and the two bit lines BL_0L and BL_0R are connected to the memory cell 11-00. The word line drivers 12-0 and 12-1 have the same configuration and the same occupied area.

FIG. 4 is a diagram illustrating a configuration of the memory cell 11-00 illustrated in FIG. 3. In FIG. 4, Vdd denotes a power-supply voltage, and Vss denotes the ground voltage. The other memory cells 11-01, 11-10, and 11-11 have the same configuration of the memory cell 11-00. The memory cell 11-00 has six transistors Tr11 to Tr16.

The memory cell 1-00 illustrated in FIG. 2 has the same configuration of the memory cell 11-00 illustrated in FIG. 4. A cell area occupied by the memory cell 1-00 is the same as a cell area occupied by the memory cell 11-00. A read operation is performed by accessing the memory cell 1-00 using a pair of one word line and one bit line. In a 2-read operation, two word lines and two bit lines are used. In a 1-read operation, one word line and one bit line are used. When the 1-read operation is performed for the memory cell 1-00 illustrated in FIG. 2, only the capacitance of one transfer gate (Tr5 or Tr6) of the memory cell 1-00 influences the word line (WL_0L or WL_0R) as a load imposed thereon. Thus, when the 2R1W-SRAM illustrated in FIG. 1 operates as an SRAM that performs the 1-read operation, the power consumption of the 2R1W-SRAM in a case of the 1-read operation may be reduced, compared with the power consumption of the 1R1W-SRAM illustrated in FIG. 3 in a case of the 1-read operation. The occupied area of the word line drivers 2-0L and 2-0R that drive the word lines may be reduced, compared with that of the word line driver 12-0 illustrated in FIG. 3.

In order to increase a speed at which an operation of an SRAM having a configuration such as the configuration illustrated in FIGS. 1 and 2 is performed, in particular, in order to increase a speed at which a read operation of the SRAM is performed, it is desirable to sharply increase the potential of word lines. Accordingly, in order to sharply increase the potential of word lines, it is desirable to increase the physical size of word line drivers or to reduce a load imposed on each of the word line drivers by dividing a memory-cell array. Even when either the physical size of word line drivers is increased or a load imposed on each of the work-line drivers is reduced, the area of the entire SRAM is increased, and the power consumption of the SRAM is increased.

It is desirable for the semiconductor memory device of the related art to realize a high-speed operation without causing the occupied area of a driver section to be increased or causing the power consumption of the entire semiconductor memory device to be increased.

[Patent Document 1] Japanese Laid-open Patent Publication No. 2006-269023
[Patent Document 2] Japanese Laid-open Patent Publication No. 5-218354
[Patent Document 3] Japanese Laid-open Patent Publication No. 6-295588

SUMMARY

According to an aspect of an embodiment, a semiconductor memory device includes a plurality of memory cells, a plurality of bit lines respectively connected to the memory cells, a plurality of first and second word lines respectively connected to the memory cells, a plurality of first drivers for driving the first word lines selected during a read operation, and a plurality of second drivers for driving the second word lines selected during a write operation, the second driver having a different drive capability from the first driver's.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

Hereinafter, semiconductor memory devices according to disclosed embodiments will be described with reference to the accompanying drawings.

Figure 5:
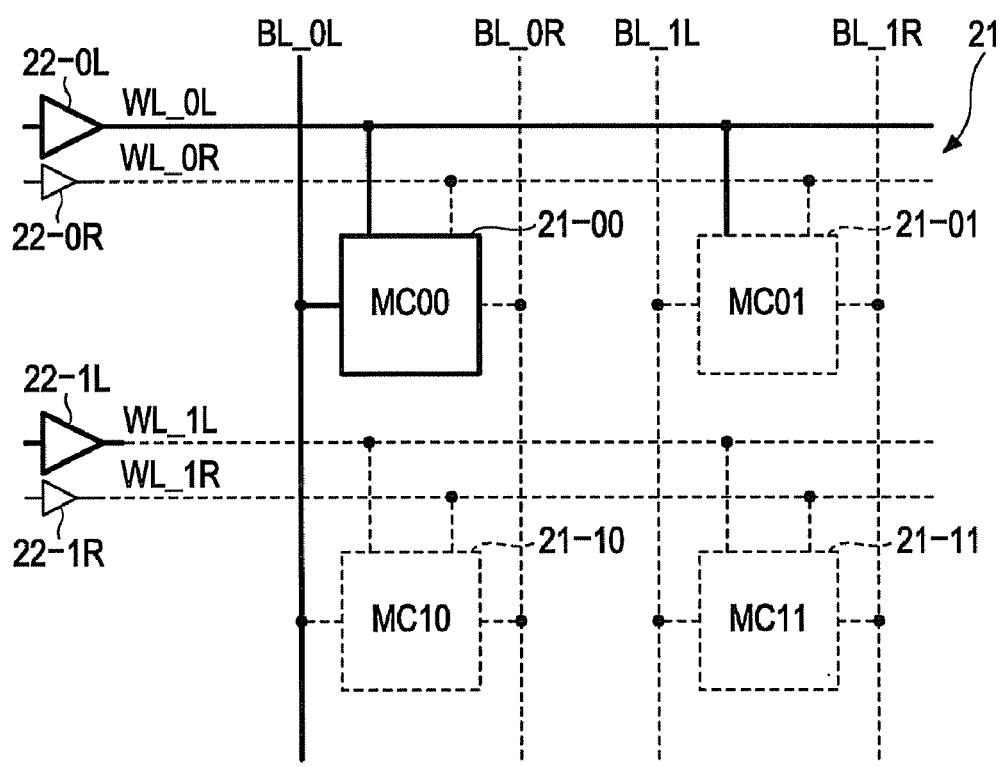
FIG. 5 is a diagram illustrating a configuration of an example of a semiconductor memory device according to a first embodiment.

FIG. 5 is a diagram illustrating a configuration of an example of a semiconductor memory device according to a first embodiment. In the present embodiment, the present technique is applied to a 1R1W-SRAM.

In FIG. 5, BL_0L, BL_0R, BL_1L, and BL_1R denote bit lines. In FIG. 5, WL_0L, WL_0R, W_1L, and W_1R denote word lines. In FIGS. 5, 21-00, 21-01, 21-10, and 21-11 (MC00, MC01, MC10, and MC11) denote memory cells that are provided in a memory cell array 21. In FIG. 5, 22-0L, 22-0R, 22-1L, and 22-1R are word line drivers that drive the word lines WL_0L, WL_0R, W_1L, and W_1R, respectively. In FIG. 5, only the four memory cells 21-00, 21-01, 21-10, and 21-11 provided in the memory-cell array 21 are illustrated for simplicity of description. Two word lines WL_xL and WL_xR and two bit lines BL_xL and BL_xR are connected to each memory cell MC. For example, the two word lines WL_0L and WL_0R and the two bit lines BL_0L and BL_0R are connected to the memory cell 21-00. The word line drivers 22-0L and 22-1L have the same configuration and the same occupied area. The word line drivers 22-0R and 22-1R have the same configuration and the same occupied area. Note that an occupied area is an area in a plan view when viewed from a direction perpendicular to a semiconductor substrate surface (not illustrated) on which an SRAM is formed, i.e., a reference plane.

Figure 2:
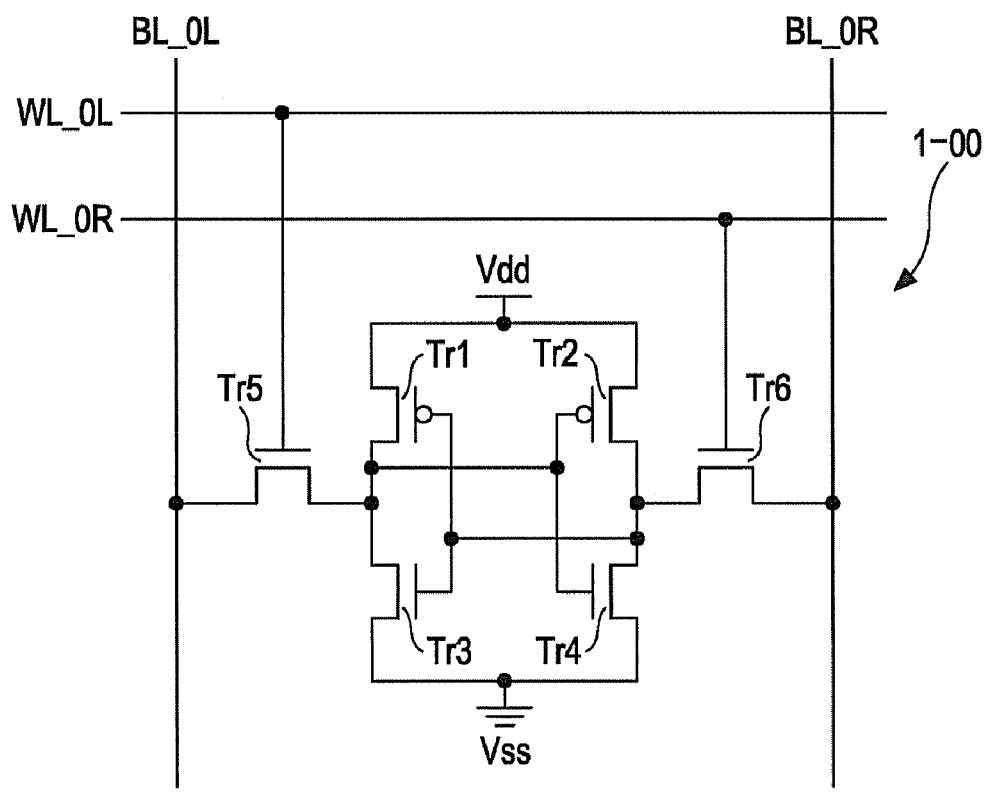
FIG. 2 is a diagram illustrating a configuration of a memory cell illustrated in FIG. 1.
Figure 4:
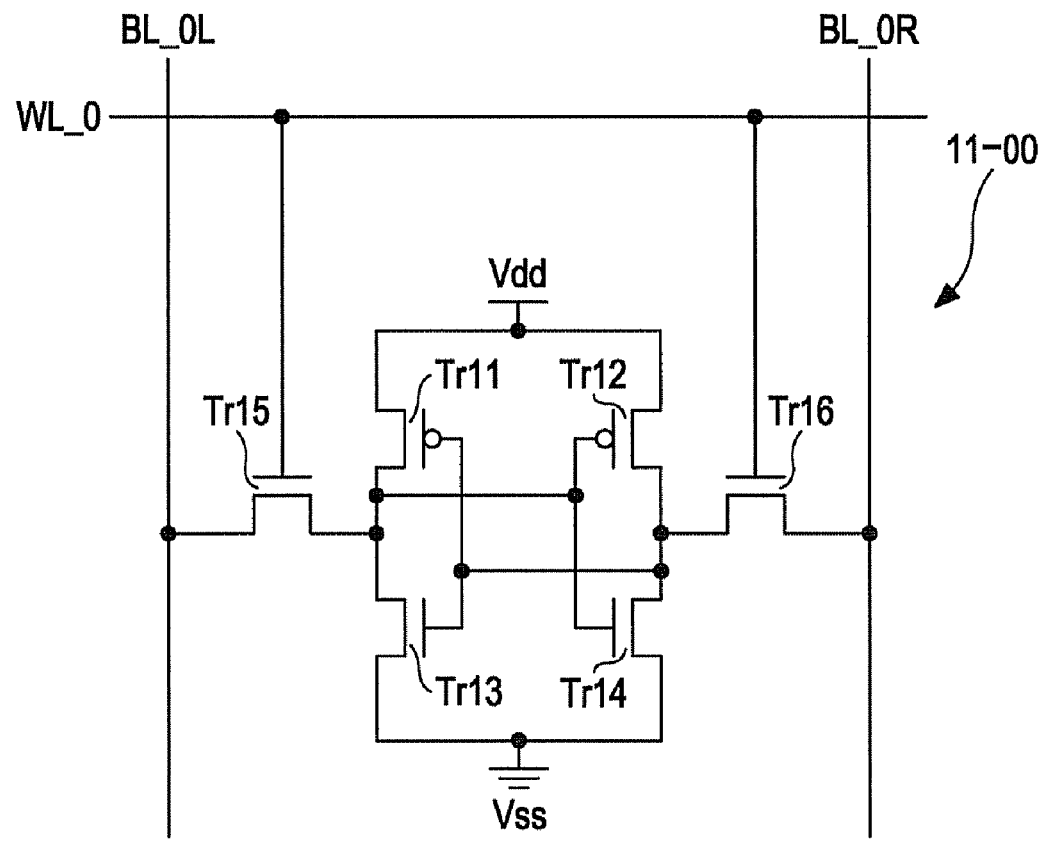
FIG. 4 is a diagram illustrating a configuration of a memory cell illustrated in FIG. 3.

Each of the memory cells 21-00, 21-01, 21-10, and 21-11 has a configuration in which p-channel metal oxide semiconductor (MOS) transistors and n-channel metal oxide semiconductor (MOS) transistors that are, for example, the same as the p-channel transistors and the n-channel transistors included in the memory cell 1-00 illustrated in FIG. 2 or the memory cell 11-00 illustrated in FIG. 4 are connected to one another. Accordingly, an illustration and a description thereof are omitted.

In the present embodiment, for a designed operating speed (or an operating frequency) of the 1R1W-SRAM, a word line driver 22-xL, which drives the word line WL_xL that is one of the two word lines WL_xL and WL_xR connected to each memory cell MC and that is activated (i.e., selected) by a read operation, and a word line driver 22-xR, which drives the other word line WL_xR, are formed so that the size of the word line driver 22-xL is larger than the size of the word line driver 22-xR. Note that a size is a size of the above described occupied area. In other words, the drive capability of the word line driver 22-xL which is activated by the read operation is set to be higher than the drive capability of the word line driver 22-xR.

Figure 1:
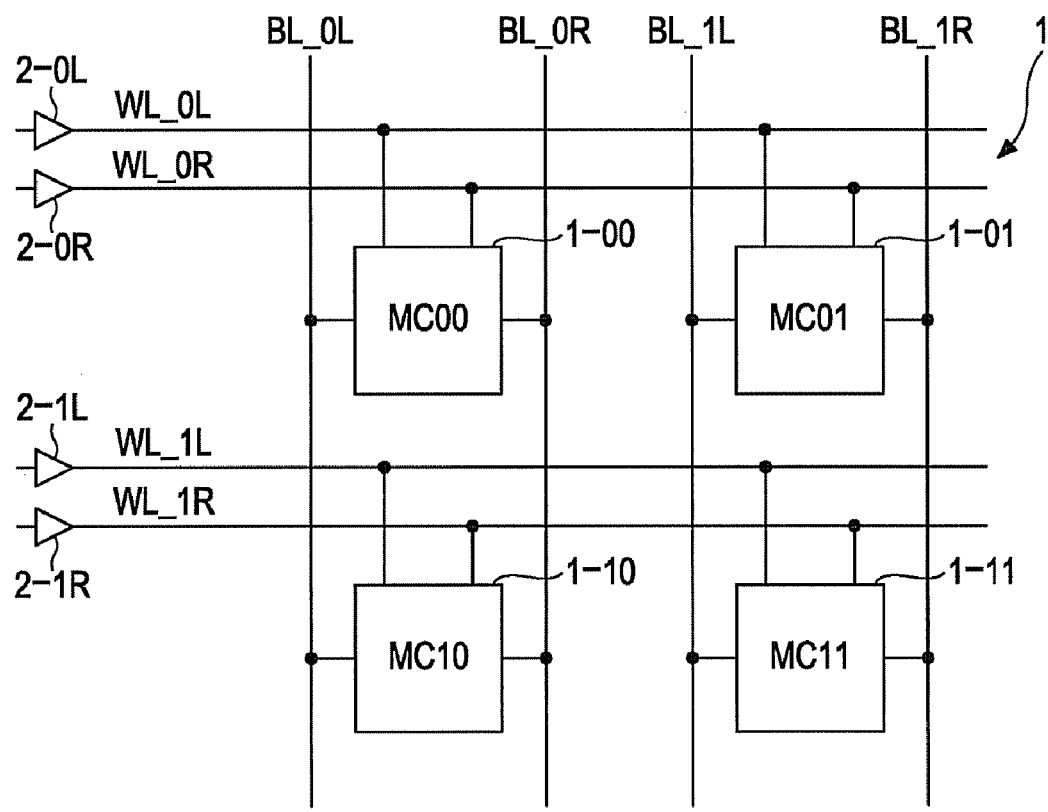
FIG. 1 is a diagram illustrating a configuration of an example of a 2R1W-SRAM.
Figure 6A:
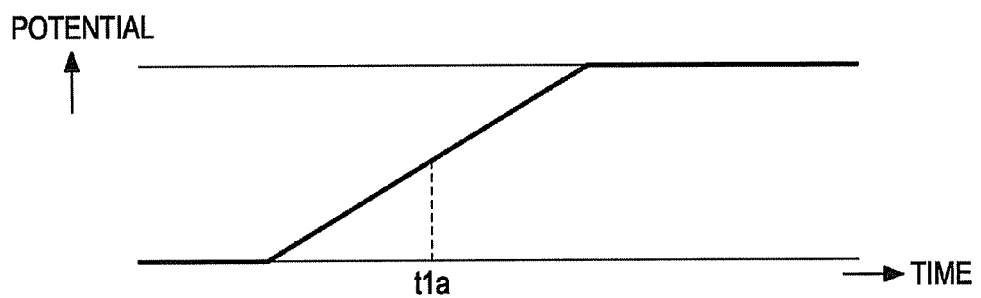
FIGS. 6A and 6B are graphic charts for explaining the potential of a word line.
Figure 6B:
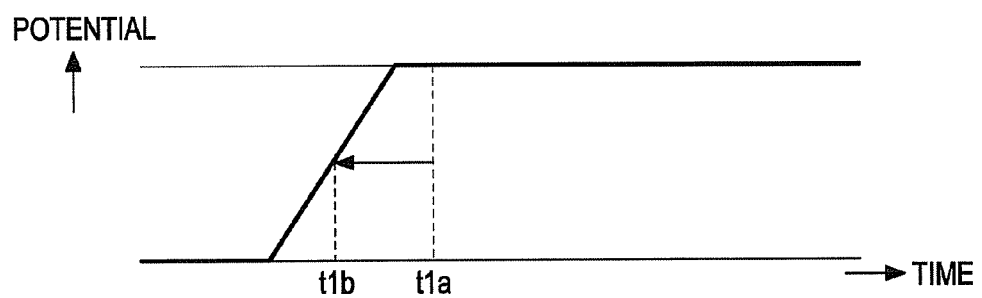

FIGS. 6A and 6B are graphic charts for explaining the potential of a word line. In FIGS. 6A and 6B, the vertical axis represents the potential of the word line WL_xL in arbitrary units, and the horizontal axis represents time in arbitrary units. FIG. 6A illustrates, for example, the potential of the word line WL_0L in a case in which the word line WL_0L illustrated in FIG. 1 is selected, and FIG. 6B illustrates, for example, the potential of the word line WL_0L in a case in which the word line WL_0L illustrated in FIG. 5 is selected. As is also clear from comparison between FIGS. 6A and 6B. In FIG. 6A, a time at which the potential of the word line WL_0L reaches a level that is about half the maximum value in accordance with the drive capability of the word line driver 2-0L is a time t1$a$. However, in FIG. 6B, because the size and drive capability of the word line driver 22-0L are larger than those of the word line driver 2-0L, a time at which the potential of the word line WL_0L reaches a level that is about half the maximum value moves to a time t1$b$ that is earlier than the time t1$a$.

In order to increase a speed at which an operation of an SRAM is performed, in particular, in order to increase a speed at which a read operation is performed, it is necessary to sharply increase the potential of word lines. Accordingly, in order to sharply increase the potential of word lines, in the present embodiment, the word line driver 22-xL, which drives the word line WL_xL that is one of the two word lines, and a word line driver 22-xR, which drives the other word line WL_xR, are formed so that the size of the word line driver 22-xL is larger than the size of the word line driver 22-xR. In this manner, a required high speed operation of the SRAM may be realized without increasing the area of the entire SRAM or without increasing the power consumption of the SRAM.

Figure 3:
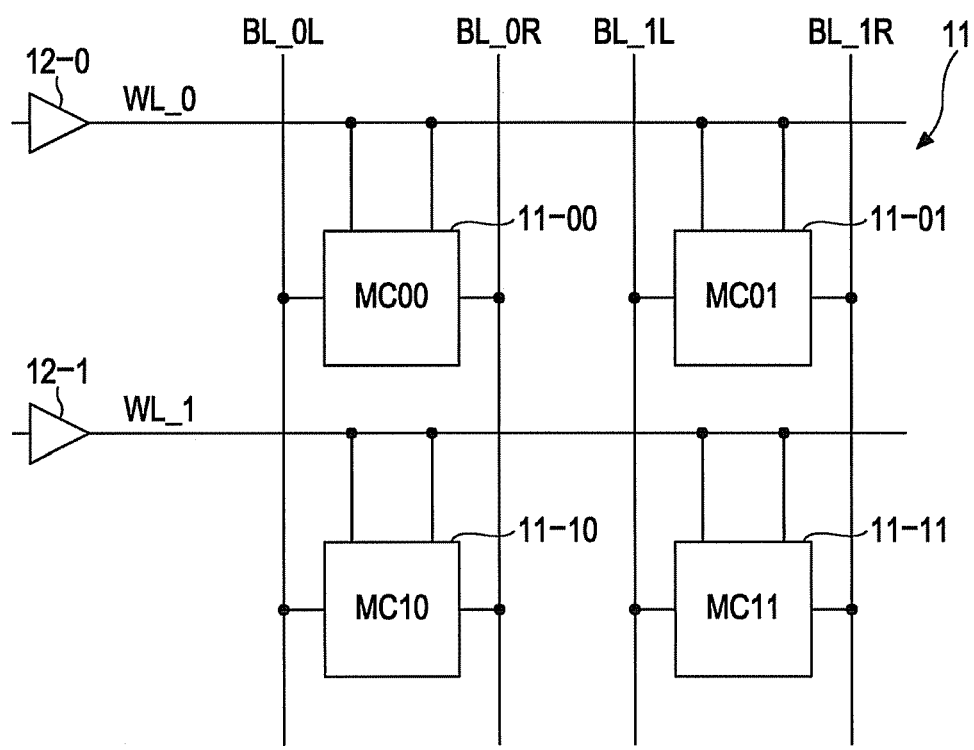
FIG. 3 is a diagram illustrating a configuration of an example of a 1R1W-SRAM.

By increasing the size of the word line driver 22-xL that drives the word line WL_xL which is one of the two word lines, the occupied area of the entire SRAM is increased. Because the size of the word line driver 22-xR that drives the other word line WL_xR is not increased (i.e., may be reduced), the increase in the occupied area of the entire SRAM may be minimized. In short, it is only necessary that the size of the word line driver 22-xL which is one of the two word line drivers be larger than the size of the word line driver 2-xL illustrated in FIG. 1. It is only necessary that the size of the other word line driver 22-xR be smaller than the size of the word line driver 22-xL, and the size of the word line driver 22-xR may be the same as or slightly different from (i.e., larger or smaller than) that of the word line driver 2-xR illustrated in FIG. 1. Whether the size of the word line driver 22-xR is to be made larger than, smaller than, or the same as the size of the word line driver 2-xR illustrated in FIG. 1 may be determined in accordance with a designed operating speed of the SRAM and an allowable range of increase in the occupied area of the entire SRAM when the word line drivers 22-xL and 22-xR are formed so that the size of the word line driver 22-*x*L is larger than the size of the word line driver 22-*x*R. Particularly, when the size of a pair of the word line drivers 22-*x*L and 22-*x*R is smaller than, for example, the size of one word line driver 12-*x* included in the SRAM in which a read operation and a write operation are performed using one word line as illustrated in FIG. 3, a high positive effect may be obtained in terms of occupied area. In other words, in the present embodiment, a high speed operation may be realized without causing the occupied area of a driver section to be increased or causing the power consumption of the entire SRAM to be increased.

Figure 7A:
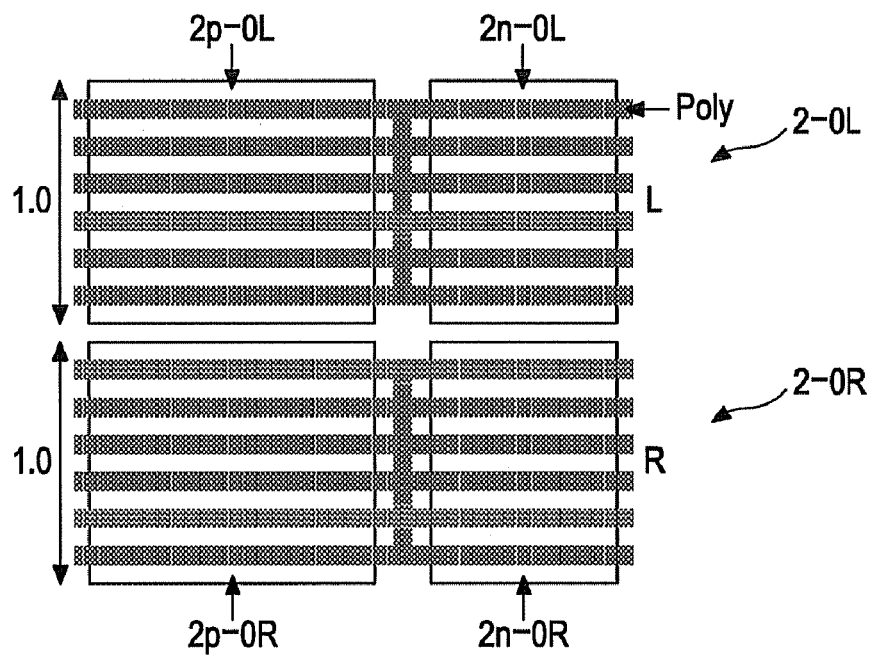
FIGS. 7A and 7B are plan views for explaining examples of physical layouts of driver sections.
Figure 7B:
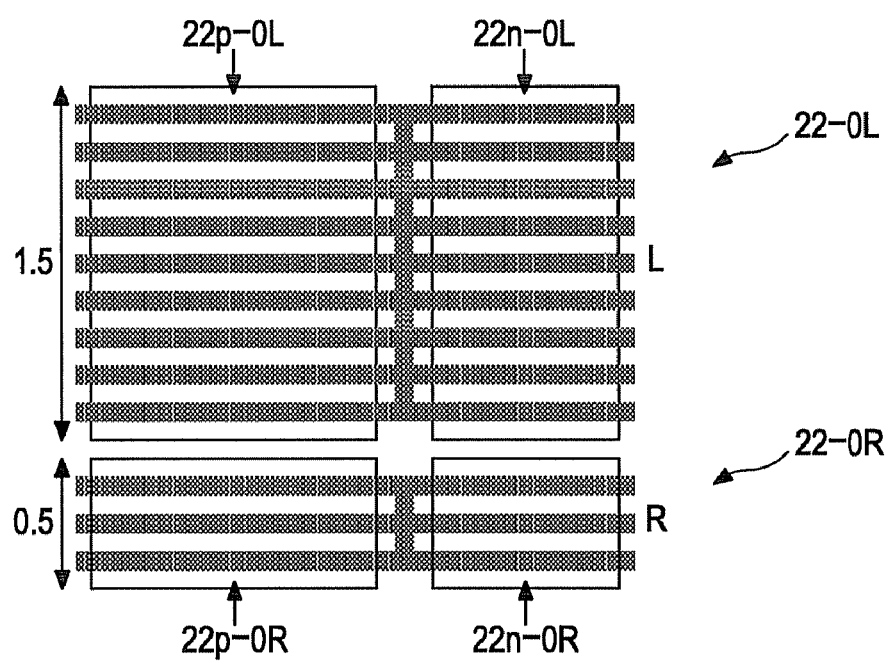

FIGS. 7A and 7B are plan views for explaining examples of layouts of driver portions. FIG. 7A illustrates a driver section that is formed using, for example, the word line drivers 2-0L and 2-0R illustrated in FIG. 1, and FIG. 7B illustrates a driver section that is formed using, for example, the word line drivers 22-0L and 22-0R illustrated in FIG. 5. The word line driver 2-0L has a p-channel MOS transistor region 2*p*-0L, in which p-channel MOS transistors are formed, and an n-channel MOS transistor region 2*n*-0L, in which n-channel MOS transistors are formed. On the other hand, the word line driver 22-0L has a p-channel MOS transistor region 22*p*-0L, in which p-channel MOS transistors are formed, and an n-channel MOS transistor region 22*n*-0L, in which n-channel MOS transistors are formed. As is also clear from comparison between FIGS. 7A and 7B, in the examples, the size of the p-channel MOS transistor region 22*p*-0L and the size of the n-channel MOS transistor region 22*n*-0L of the word line driver 22-0L are larger than the size of the p-channel MOS transistor region 2*p*-0L and the size of the n-channel MOS transistor region 2*n*-0L, respectively, of the corresponding word line driver 2-0L. Furthermore, the size of a p-channel MOS transistor region 22*p*-0R and the size of an n-channel MOS transistor region 22*n*-0R of the word line driver 22-0R are smaller than the size of a p-channel MOS transistor region 2*p*-0R and the size of an n-channel MOS transistor region 2*n*-0R, respectively, of the corresponding word line driver 2-0R.

In the examples illustrated in FIGS. 7A and 7B, the length of the individual MOS transistor regions 2*p*-0L and 2*p*-0R in the horizontal direction and the length of the individual MOS transistor regions 22*p*-0L and 22*p*-0R in the horizontal direction are the same. Furthermore, the length of the individual MOS transistor regions 2*n*-0L and 2*n*-0R in the horizontal direction and the length of the individual MOS transistor regions 22*n*-0L and 22*n*-0R in the horizontal direction are the same. However, a ratio of the length of the individual MOS transistor regions 2*p*-0L and 2*n*-0L in the vertical direction to the length of the individual MOS transistor regions 2*p*-0R and 2*n*-0R in the vertical direction is 1.0:1.0 (both of the values are in arbitrary units). On the other hand, a ratio of the length of the individual MOS transistor regions 22*p*-0L and 22*n*-0L in the vertical direction to the length of the individual MOS transistor regions 22*p*-0R and 22*n*-0R in the vertical direction is 1.5:0.5 (both of the values are in the arbitrary units). In the examples illustrated in FIGS. 7A and 7B, the size of the driver section illustrated in FIG. 7A is the same as that of the driver section illustrated in FIG. 7B.

Figure 8A:
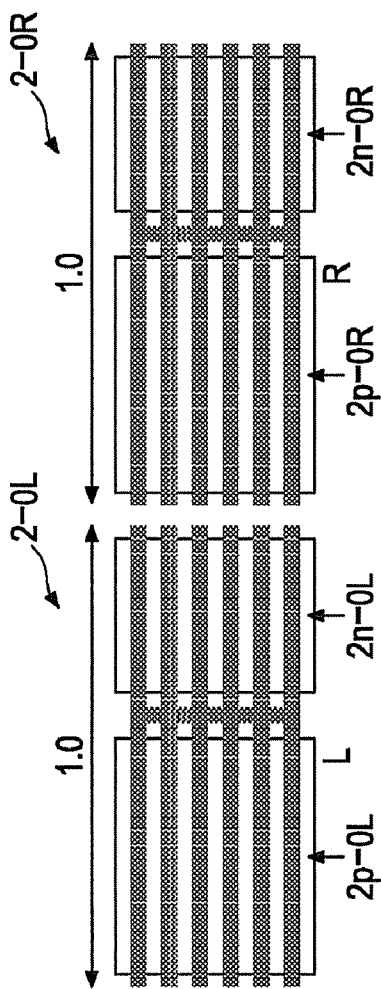
FIGS. 8A and 8B are plan views for explaining other examples of the physical layouts of the driver sections.
Figure 8B:
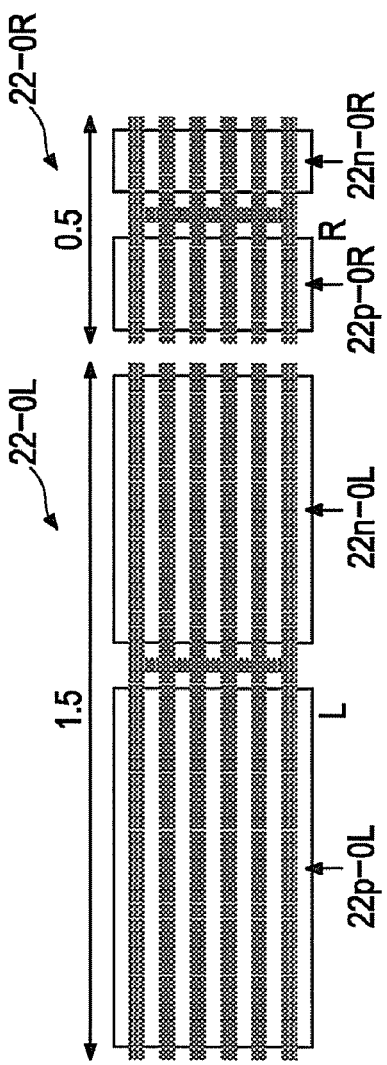

FIGS. 8A and 8B are plan views for explaining other examples of the layouts of the driver sections. In FIGS. 8A and 8B, elements identical to those illustrated in FIGS. 7A and 7B are denoted by the same reference numerals, and a description thereof is omitted. In FIGS. 7A and 7B, the word line drivers 2-*x*L and 2-*x*R and the word line drivers 22-*x*L and 22-*x*R are disposed in the vertical direction. However, in FIGS. 8A and 8B, the word line drivers 2-*x*L and 2-*x*R and the word line drivers 22-*x*L and 22-*x*R are disposed in the horizontal direction.

The size of the p-channel MOS transistor region 22*p*-0L and the size of the n-channel MOS transistor region 22*n*-0L of the word line driver 22-0L are larger than the size of the p-channel MOS transistor region 2*p*-0L and the size of the n-channel MOS transistor region 2*n*-0L, respectively, of the corresponding word line driver 2-0L. The size of the p-channel MOS transistor region 22*p*-0R and the size of the n-channel MOS transistor region 22*n*-0R of the word line driver 22-0R are smaller than the size of the p-channel MOS transistor region 2*p*-0R and the size of the n-channel MOS transistor region 2*n*-0R, respectively, of the corresponding word line driver 2-0R.

In the examples illustrated in FIGS. 8A and 8B, the length of the individual MOS transistor regions 2*p*-0L, 2*n*-0L, 2*p*-0R, and 2*n*-0R in the vertical direction and the length of the individual MOS transistor regions 22*p*-0L, 22*n*-0L, 22*p*-0R, and 22*n*-0R in the vertical direction are the same. Furthermore, the lengths of the individual MOS transistor regions 2*p*-0L and 2*p*-0R in the horizontal direction are the same, and the lengths of the individual MOS transistor regions 2*n*-0L and 2*n*-0R in the horizontal direction are the same. However, the lengths of the individual MOS transistor regions 22*p*-0L, 22*n*-0L, 22*p*-0R, and 22*n*-0R in the horizontal direction are different from one another. Furthermore, a ratio of the length of the word line driver 2-0L to the length of the word line driver 2-0R in the horizontal direction is 1.0:1.0 (both of the values are in arbitrary units). A ratio of the length of the word line driver 22-0L to the length of the word line driver 22-0R in the horizontal direction is 1.5:0.5 (both of the values are in the arbitrary units). In the examples illustrated in FIGS. 8A and 8B, the size of the driver section illustrated in FIG. 8A is the same as the size of the driver section illustrated in FIG. 8B.

In the examples illustrated in FIGS. 7A and 7B and FIGS. 8A and 8B, the size of the driver section illustrated in each of FIGS. 7A and 8A is the same as the size of the driver section illustrated in a corresponding one of FIGS. 7B and 8B. However, in the driver section illustrated in each of FIGS. 7B and 8B, the drive capability of the word line driver 22-*x*L that drives the word line WL_*x*L which is activated by the read operation is set to be higher than the drive capability of the word line driver 2-*x*L. The drive capability of the word line driver 22-*x*R that drives the word line WL_*x*R is set to be equal to or lower than the drive capability of the word line driver 2-*x*R. Thus, a high-speed operation may be realized without causing the occupied area of the drive section to be increased or causing the power consumption of the entire SRAM to be increased.

Figure 9:
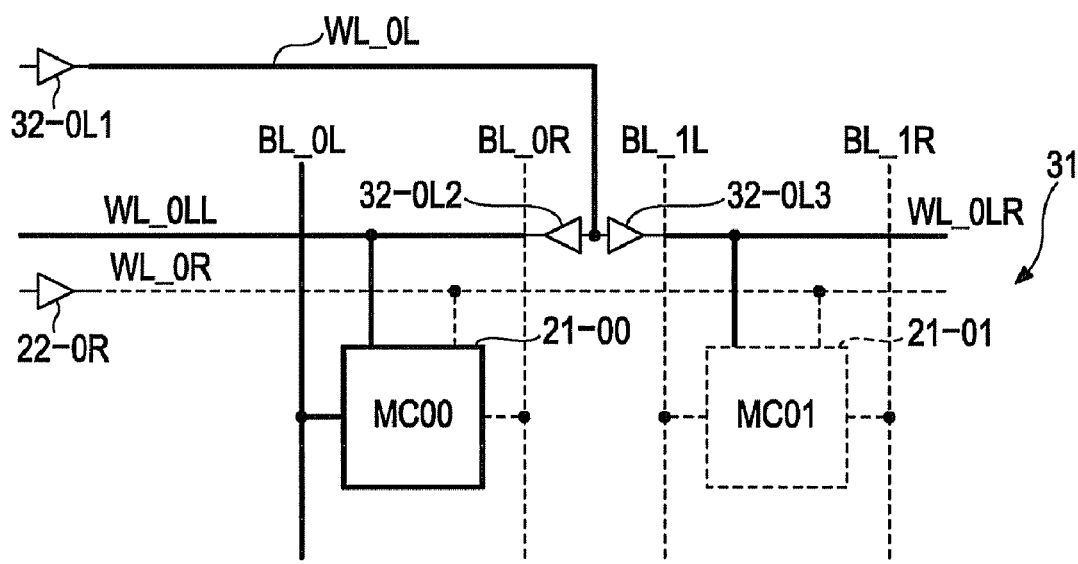
FIG. 9 is a diagram illustrating a configuration of an example of a semiconductor memory device according to a second embodiment.

FIG. 9 is a diagram illustrating a configuration of an example of a semiconductor memory device according to a second embodiment. In the present embodiment, the present technique is applied to a 1R1W-SRAM. In FIG. 9, elements identical to those illustrated in FIG. 5 are denoted by the same reference numerals, and a description thereof is omitted.

In the present embodiment, in order to distribute a load imposed on a word line, division of the word line is performed. Specifically, from a pair of the word lines WL_*x*L and WL_*x*R, only the word line WL_*x*L that is activated by the read operation is divided into two word lines. In the example illustrated in FIG. 9, the word line WL_0L is divided into two word lines, namely, divided word lines WL_0LL and WL_0LR. Furthermore, the word line WL_0L is driven by a word line driver 32-0L1. The divided word line WL_0LL is further driven by a corresponding word line driver 32-0L2, and the divided word line WL_0LR is further driven by a corresponding word line driver 32-0L3. As described above, a driver section for the pair of the word lines WL_0L and WL_0R is formed using the word line drivers 32-0L1, 32-0L2, 32-0L3, and 22-0R.

Note that the number of divisions for a word line is two in the example illustrated in FIG. 9. However, in FIG. 9, when three or more memory cells MC are provided in a memory-cell array 31, the number of divisions for a word line may be set to an appropriate value that is equal to or larger than two.

The drive capability of a combination of the word line drivers 32-0L1 and 32-0L2 or a combination of the word line drivers 32-0L1 and 32-0L3 is set to be, for example, higher than the drive capability of the word line driver 2-0L illustrated in FIG. 1, whereby a speed at which an operation of the SRAM is performed may be increased, and, in particular, a speed at which the read operation is performed may be increased. Furthermore, the word line drivers 32-0L1, 32-0L2, and 32-0L3 are provided only for the word line WL_0L that is activated by the read operation. Only the word line driver 22-0R may be provided for the other word line WL_0R. In other words, by providing three word line drivers 32-$x$L1, 32-$x$L2, and 32-$x$L3 for the word line WL_xL, the occupied area of the entire SRAM is increased. Because the size of the word line driver 22-$x$R that drives the other word line WL_xR is not increased (i.e., may be reduced), the increase in the occupied area of the entire SRAM may be minimized. Thus, a high-speed operation may be realized without causing the occupied area of a driver section to be increased or causing the power consumption of the entire SRAM to be increased.

Figure 10A:
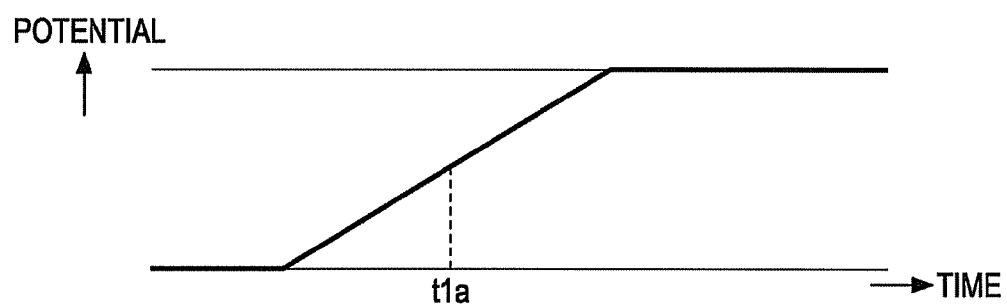
FIGS. 10A and 10B are graphic charts for explaining the potential of a word line.
Figure 10B:
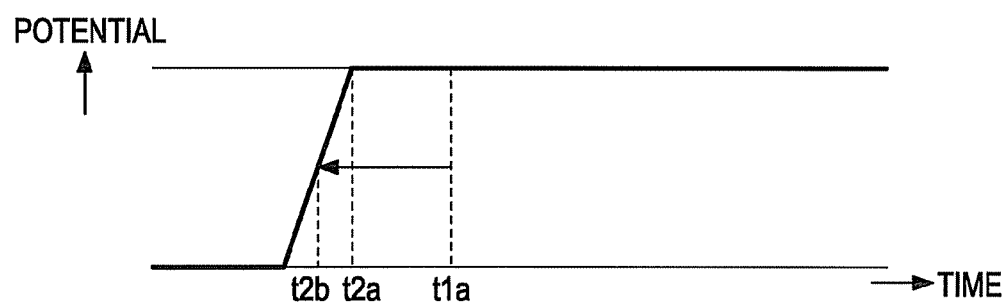

FIGS. 10A and 10B are graphic charts for explaining the potential of a word line. In FIGS. 10A and 10B, the vertical axis represents the potential of the word line WL_xL in arbitrary units, and the horizontal axis represents time in arbitrary units. FIG. 10A illustrates, for example, the potential of the word line WL_0L in a case in which the word line WL_0L illustrated in FIG. 1 is selected, and FIG. 10B illustrates, for example, the potential of the word line WL_0L in a case in which the word line WL_0LL illustrated in FIG. 9 is selected. As is also clear from comparison between FIGS. 10A and 10B, in FIG. 10A, a time at which the potential of the word line WL_0L reaches a level that is about half the maximum value in accordance with the drive capability of the word line driver 2-0L is the time t1$a$. However, in FIG. 10B, because the drive capability of the combination of the word line drivers 32-0L1 and 32-0L2 is higher than the drive capability of the word line driver 2-0L, a time at which the potential of the divided word line WL_0LL reaches a level that is about half the maximum value moves to a time t2$b$ that is earlier than the time t1$a$. A time t2$a$ illustrated in FIG. 10B is a time at which the potential of the divided word line WL_0LL reaches the maximum value.

The layout of the driver portion may be basically determined as in the examples that are described with reference to FIGS. 7A and 7B or FIGS. 8A and 8B except that the three word line drivers 32-$x$L1, 32-$x$L2, and 32-$x$L3 are provided for the word line WL_xL.

Figure 11:
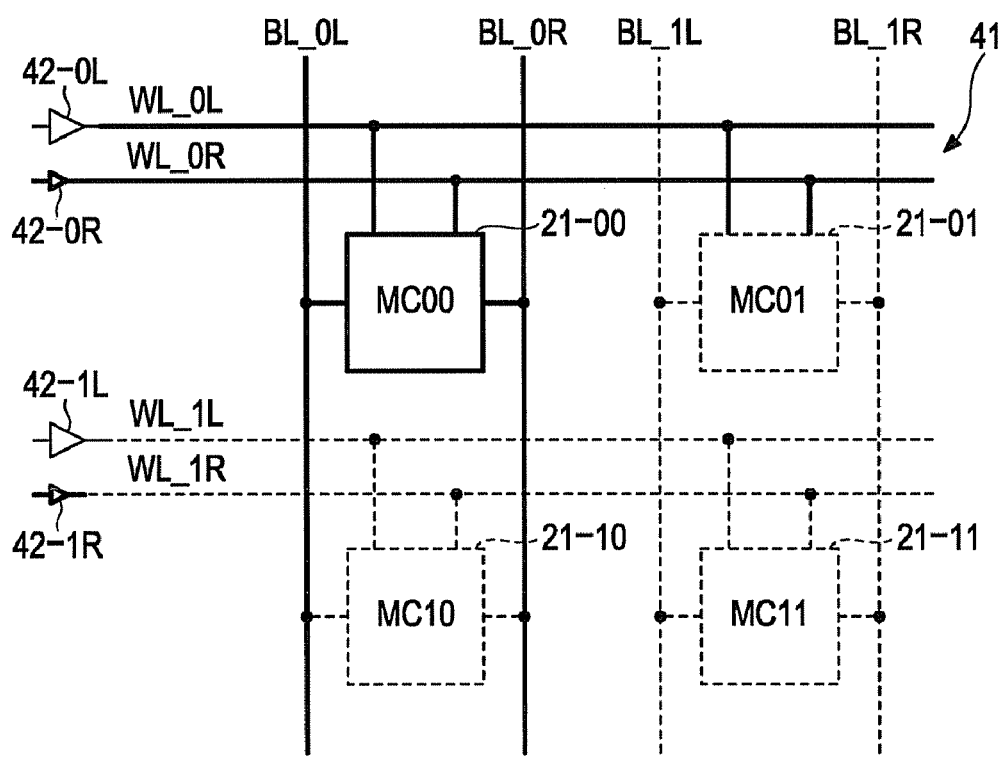
FIG. 11 is a diagram illustrating a configuration of an example of a semiconductor memory device according to a third embodiment.

FIG. 11 is a diagram illustrating a configuration of an example of a semiconductor memory device according to a third embodiment. In the present embodiment, the present technique is applied to a 1R1W-SRAM. In FIG. 11, elements identical to those illustrated in FIG. 5 are denoted by the same reference numerals, and a description thereof is omitted.

In the present embodiment, for a designed operating speed (or an operating frequency) of the 1R1W-SRAM, a word line driver 42-$x$R, which drives the word line WL_xR that is one of the two word lines WL_xL and WL_xR connected to each memory cell MC and that is activated (i.e., selected) by the write operation, and a word line driver 42-$x$L, which drives the other word line WL_xL, are formed so that the size of the word line driver 42-$x$R is smaller than the size of the word line driver 42-$x$L. In other words, the drive capability of the word line driver 42-$x$R that is activated by the write operation is set to be lower than the drive capability of the word line driver 42-$x$L. The reason for this is that, when a time allowance that is longer than a certain value is provided for the write operation (a time margin is provided for the write operation), the potential of the word lines may be slowly increased. Accordingly, the size of the word line driver 42-$x$R that is activated by the write operation is reduced as small as possible, thereby reducing the occupied area of a driver section and reducing power consumption in a case of the write operation.

Figure 12A:
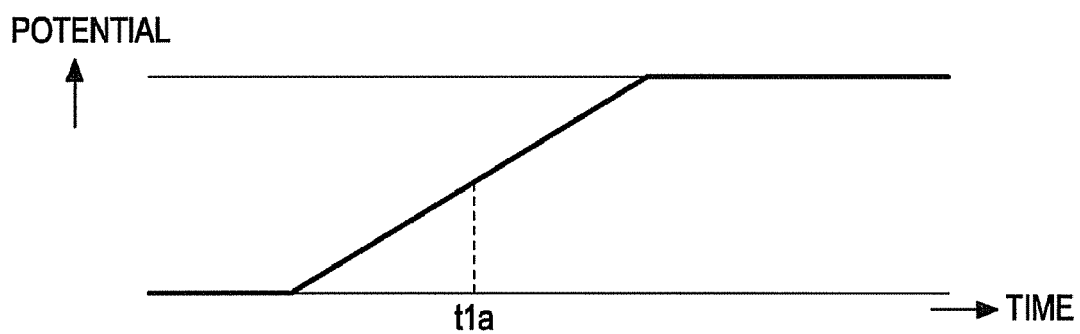
FIGS. 12A and 12B are graphic charts for explaining the potential of a word line.
Figure 12B:
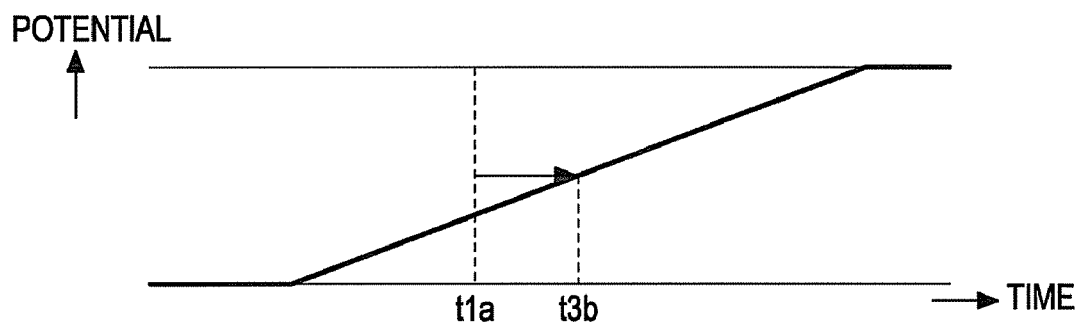

FIGS. 12A and 12B are graphic charts for explaining the potential of a word line. In FIGS. 12A and 12B, the vertical axis represents the potential of the word line WL_xR in arbitrary units, and the horizontal axis represents time in arbitrary units. FIG. 12A illustrates, for example, the potential of the word line WL_0R in a case in which the word line WL_0R illustrated in FIG. 1 is selected, and FIG. 12B illustrates, for example, the potential of the word line WL_0R in a case in which the word line WL_0R illustrated in FIG. 11 is selected. As is also clear from comparison between FIGS. 12A and 12B, in FIG. 12A, a time at which the potential of the word line WL_0R reaches a level that is about half the maximum value in accordance with the drive capability of the word line driver 2-0R is a time t1$a$. However, in FIG. 12B, because the size and drive capability of the word line driver 42-0R are smaller than those of the word line driver 2-0R, a time at which the potential of the word line WL_0R reaches a level that is about half the maximum value moves to a time t3$b$ that is later than the time t1$a$.

When a time margin is provided for a write operation of an SRAM, it is not necessary to sharply increase the potential of word lines that are activated by the write operation. Accordingly, in order to slowly increase the potential of word lines, in the present embodiment, the word line driver 42-$x$R, which drives the word line WL_xR that is one of the two word lines, and the word line driver 42-$x$L, which drives the other word line WL_xL, are formed so that the size of the word line word line driver 42-$x$R is smaller than the size of the word line driver 42-$x$L. In this manner, a designed frequency operation of the SRAM may be realized without increasing the area of the entire SRAM or without increasing the power consumption of the SRAM.

By reducing the size of the word line driver 42-$x$R that drives the word line WL_xR which is one of the two word lines, the occupied area of the entire SRAM is not increased because the size of the word line driver 42-$x$L that drives the other word line WL_xL is not increased (i.e., may be reduced). In short, it is only necessary that the size of the word line driver 42-$x$R which is one of the two word line drivers be smaller than the size of the word line driver 2-$x$R illustrated in FIG. 1. It is only necessary that the size of the other word line driver 42-$x$L be larger than the size of the word line driver 42-$x$R, and the size of the word line driver 42-$x$L may be the same as or slightly different from (i.e., larger or smaller than) that of the word line driver 2-$x$L illustrated in FIG. 1. Whether the size of the word line driver 42-$x$L is to be made larger than, smaller than, or the same as the size of the word line driver 2-$x$L illustrated in FIG. 1 may be determined in accordance with a designed operating speed of the SRAM and an allowable range of increase in the occupied area of the entire SRAM when the word line drivers 42-$x$R and 42-$x$L are formed so that the size of the word line driver 42-xR is smaller than the size of the word line driver 42-xL. When a time margin is provided for the write operation, even in a case in which the size of the word line driver 42-xL is the same as that of the word line driver 2-xL, by forming the word line driver 42-xR so that the size of the word line driver 42-xR is smaller than the size of the word line driver 2-xR, the occupied area of a driver section may be reduced without changing performance of the SRAM, and the power consumption of the entire SRAM may be reduced. Particularly, when the size of a pair of the word line drivers 42-xL and 42-xR is smaller than, for example, the size of one word line driver 12-x included in the SRAM in which a read operation and a write operation are performed using one word line as illustrated in FIG. 3, a high positive effect may be obtained in terms of occupied area. In other words, in the present embodiment, a high-speed operation may be realized without causing the occupied area of a driver section to be increased or causing the power consumption of the entire SRAM to be increased.

Figure 13A:
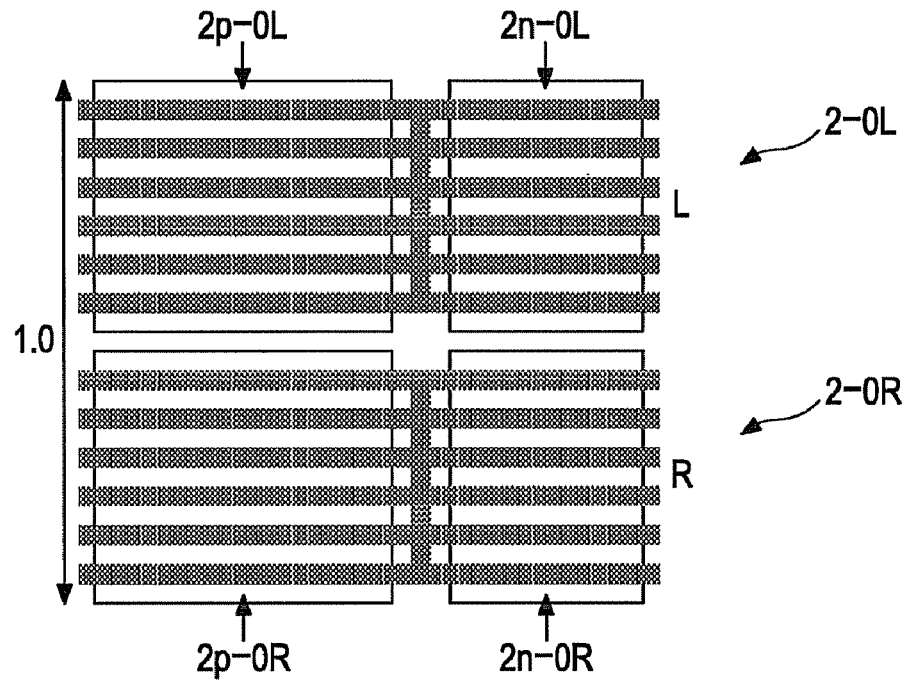
FIGS. 13A and 13B are plan views for explaining examples of physical layouts of driver sections.
Figure 13B:
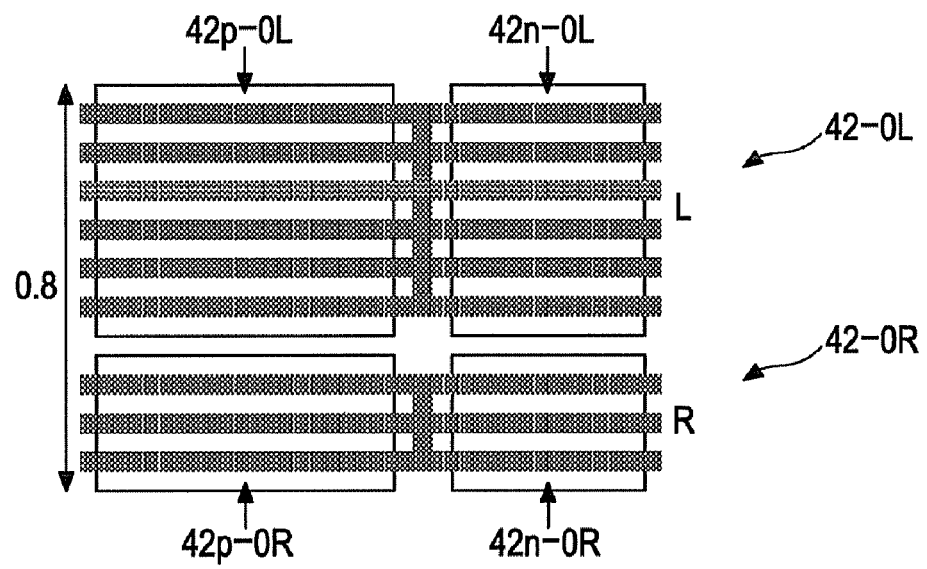

FIGS. 13A and 13B are plan views for explaining examples of layouts of driver portions. FIG. 13A illustrates a driver section that is formed using, for example, the word line drivers 2-0L and 2-0R illustrated in FIG. 1, and FIG. 13B illustrates a driver section that is formed using, for example, the word line drivers 42-0L and 42-0R illustrated in FIG. 11. The word line driver 2-0L has the p-channel MOS transistor region 2p-0L, in which p-channel MOS transistors are formed, and the n-channel MOS transistor region 2n-0L, in which n-channel MOS transistors are formed. On the other hand, the word line driver 42-0L has a p-channel MOS transistor region 42p-0L, in which p-channel MOS transistors are formed, and an n-channel MOS transistor region 42n-0L, in which n-channel MOS transistors are formed. As is also clear from comparison between FIGS. 13A and 13B, in the examples, the size of the p-channel MOS transistor region 42p-0R and the size of the n-channel MOS transistor region 42n-0R of the word line driver 42-0R are smaller than the size of the p-channel MOS transistor region 2p-0R and the size of the n-channel MOS transistor region 2n-0R, respectively, of the corresponding word line driver 2-0R. Furthermore, the size of a p-channel MOS transistor region 42p-0L and the size of an n-channel MOS transistor region 42n-0L of the word line driver 42-0L are the same as the size of the p-channel MOS transistor region 2p-0L and the size of the n-channel MOS transistor region 2n-0L, respectively, of the corresponding word line driver 2-0L.

In the examples illustrated in FIGS. 13A and 13B, the length of the individual MOS transistor regions 2p-0L and 2p-0R in the horizontal direction and the length of the individual MOS transistor regions 42p-0L and 42p-0R in the horizontal direction are the same. Furthermore, the length of the individual MOS transistor regions 2n-0L and 2n-0R in the horizontal direction and the length of the individual MOS transistor regions 42n-0L and 42n-0R in the horizontal direction are the same. However, the length of the individual MOS transistor regions 42p-0R and 42n-0R in the vertical direction is shorter than the length of the individual MOS transistor regions 2p-0R and 2n-0R in the vertical direction. When it is considered that the length of a combination of the MOS transistor regions 2p-0L and 2p-0R (or 2n-0L and 2n-0R) in the vertical direction is 1.0 in arbitrary units, the length of a combination of the MOS transistor regions 42p-0L and 42p-0R (or 42n-0L and 42n-0R) in the vertical direction is 0.8 in the arbitrary units. In the examples illustrated in FIGS. 13A and 13B, the size of the driver section illustrated in FIG. 13B is smaller than the size of the driver section illustrated in FIG. 13A.

Figure 14A:
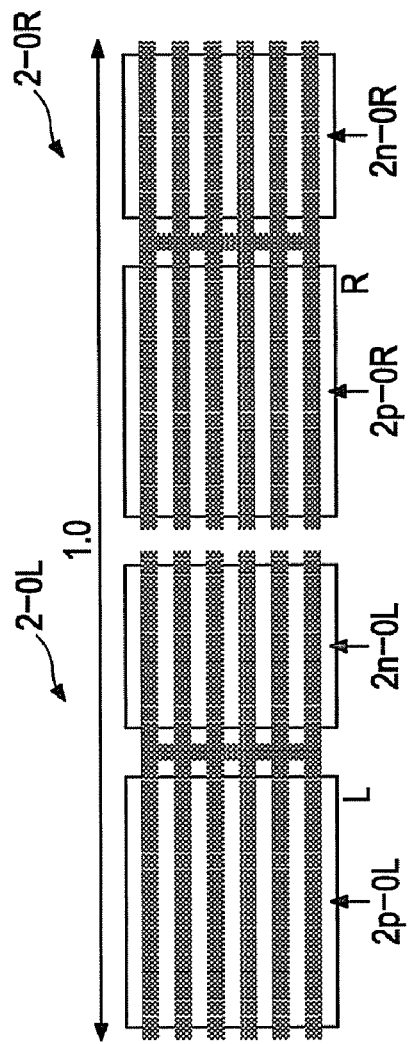
FIGS. 14A and 14B are plan views for explaining other examples of the physical layouts of the driver sections.
Figure 14B:
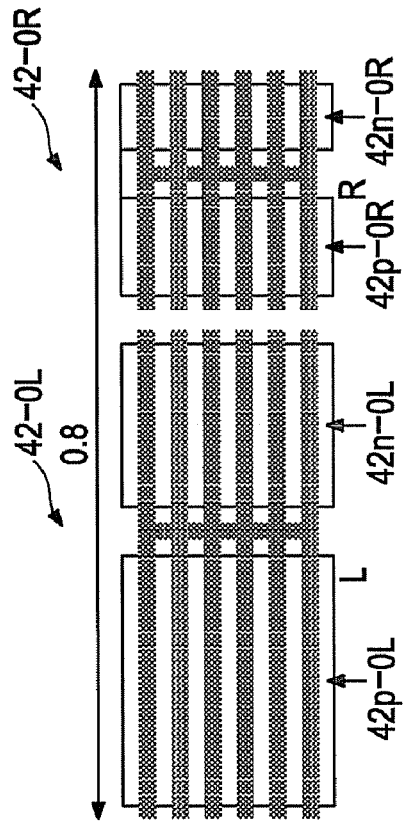

FIGS. 14A and 14B are plan views for explaining other examples of the layouts of the driver sections. In FIGS. 14A and 14B, elements identical to those illustrated in FIGS. 13A and 13B are denoted by the same reference numerals, and a description thereof is omitted. In FIGS. 13A and 13B, the word line drivers 2-0L and 2-0R and the word line drivers 42-0L and 42-0R are disposed in the vertical direction. However, in FIGS. 14A and 14B, the word line drivers 2-0L and 2-0R and the word line drivers 42-0L and 42-0R are disposed in the horizontal direction.

The size of the p-channel MOS transistor region 42p-0L and the size of the n-channel MOS transistor region 42n-0L of the word line driver 42-0L are the same as the size of the p-channel MOS transistor region 2p-0L and the size of the n-channel MOS transistor region 2n-0L, respectively, of the corresponding word line driver 2-0L. The size of the p-channel MOS transistor region 42p-0R and the size of the n-channel MOS transistor region 42n-0R of the word line driver 42-0R are smaller than the size of the p-channel MOS transistor region 2p-0R and the size of the n-channel MOS transistor region 2n-0R, respectively, of the corresponding word line driver 2-0R.

In the examples illustrated in FIGS. 14A and 14B, the length of the individual MOS transistor regions 2p-0L, 2n-0L, 2p-0R, and 2n-0R in the vertical direction and the length of the individual MOS transistor regions 42p-0L, 42n-0L, 42p-0R, and 42n-0R in the vertical direction are the same. Furthermore, the length of the individual MOS transistor regions 2p-0L and 2p-0R in the horizontal direction and the length of the individual MOS transistor region 42p-0L in the horizontal direction are the same. The length of the individual MOS transistor regions 2n-0L and 2n-0R in the horizontal direction and the length of the individual MOS transistor region 42n-0L in the horizontal direction are the same. However, the lengths of the individual MOS transistor regions 42p-0L, 42n-0L, 42p-0R, and 42n-0R in the horizontal direction are different from one another. Furthermore, when it is considered that the length of a combination of the MOS transistor regions 2p-0L, 2n-0L, 2p-0R, and 2n-0R in the horizontal direction is 1.0 in arbitrary units, the length of a combination of the MOS transistor regions 42p-0L, 42n-0L, 42p-0R, and 42n-0R in the horizontal direction is 0.8 in the arbitrary units. In the examples illustrated in FIGS. 14A and 14B, the size of the driver section illustrated in FIG. 14B is smaller than the size of the driver section illustrated in FIG. 14A.

In the examples illustrated in FIGS. 13A and 13B and FIGS. 14A and 14B, the size of the driver section illustrated in each of FIGS. 13B and 14B is smaller than the size of the driver section illustrated in a corresponding one of FIGS. 13A and 14A. In the driver section illustrated in each of FIGS. 13B and 14B, the drive capability of the word line driver 42-xR that drives the word line WL_xR which is activated by the write operation is set to be lower than the drive capability of the word line driver 2-xR. The drive capability of the word line driver 42-xL that drives the word line WL_xL is set to be equal to or lower than the drive capability of the word line driver 2-xL. Thus, the occupied area of the driver section is reduced, and a high-speed operation may be realized in a range of the time margin provided for the write operation without causing the power consumption of the entire SRAM to be increased.

In each of the first to third embodiments described above, it is supposed that a 1R1W-SRAM is used. However, a memory cell that is the same as the memory cell which is illustrated in FIG. 2 and which is used for a 2R1W-SRAM may be used as a memory cell that is used in each of the first to third embodiments. For this reason, when development of both a 1R1W-SRAM and a 2R1W-SRAM is performed, it is not necessary to independently develop each of a memory cell for the 1R1W-SRAM and a memory cell for the 2R1W-SRAM. Accordingly, a time taken by development (i.e., the number of man-hours needed to perform design and an actual production process) may be reduced. Thus, cost of development of the 1R1W-SRAM and the 2R1W-SRAM may be reduced. Note that, in a 2R1W-SRAM, two word lines are activated by a read operation, and two word lines are also activated by a write operation. However, in a 1R1W-SRAM such as the 1R1W-SRAM in each of the above-described embodiments, one word line is activated by a read operation, and two word lines are activated by a write operation.

All examples and conditional language recited herein are intended for pedagogical purposes to aid the reader in understanding the embodiment and the concepts contributed by the inventor to furthering the art, and are to be construed as being without limitation to such specifically recited examples and conditions, nor does the organization of such examples in the specification relate to a illustrating of the superiority and inferiority of the embodiment. Although the embodiments of the present invention have been described in detail, it should be understood that the various changes, substitutions, and alterations could be made hereto without departing from the spirit and scope of the invention.

What is claimed is:

1. A semiconductor memory device comprising:
a plurality of memory cells;
a plurality of bit lines respectively connected to the plurality of memory cells;
a plurality of first and second word lines respectively connected to the plurality of memory cells;
a plurality of first drivers for driving the plurality of first word lines selected during a read operation; and
a plurality of second drivers for driving the plurality of second word lines selected during a write operation, the second driver having a different drive capability from the plurality of first drivers,
wherein the drive capacity of the each of the plurality of first drivers is greater than the drive capacity of the each of the plurality of second drivers.

2. The semiconductor memory device according to claim 1, wherein an occupied area of the plurality of first drivers is greater than the occupied area of the plurality of second drivers.

3. The semiconductor memory device according to claim 1, wherein the drive capacity of each of the plurality of the first drivers is set on the basis of a designed operating speed of the semiconductor memory device.

4. A semiconductor memory device comprising:
a plurality of memory cells;
a plurality of bit lines respectively connected to the plurality of memory cells;
a plurality of first and second word lines respectively connected to the plurality of memory cells;
a plurality of first drivers for driving the plurality of first word lines selected during a read operation; and
a plurality of second drivers for driving the plurality of second word lines selected during a write operation, the second driver having a different drive capability from the plurality of first drivers,
wherein at least one of the plurality of first word lines is divided into no less than two divided word lines, the plurality of first drivers includes a third and fourth drivers, wherein the third driver drives a first divided line of the divided word lines, the fourth driver drives a second divided line of the divided word lines, and a combined drive capacity of the third and fourth drivers is greater than the drive capacity of the plurality of the second drivers.

5. The semiconductor memory device according to claim 4, wherein a combined occupied area of the third and fourth drivers is greater than an occupied area of the second drivers.

6. The semiconductor memory device according to claim 4, wherein the drive capacities of the third and fourth drivers are set on the basis of the designed operating speed of the semiconductor memory device.

7. A semiconductor memory device comprising:
a plurality of memory cells;
a plurality of bit lines respectively connected to the plurality of memory cells;
a plurality of first and second word lines respectively connected to the plurality of memory cells;
a plurality of first drivers for driving the plurality of first word lines selected during a read operation; and
a plurality of second drivers for driving the plurality of second word lines selected during a write operation, the second driver having a different drive capability from the plurality of first drivers,
wherein the drive capacity of the plurality of second drivers is set on the basis of the designed operating speed for the semiconductor memory device.

8. A semiconductor memory device comprising:
a plurality of memory cells;
a plurality of bit lines respectively connected to the plurality of memory cells;
a plurality of first and second word lines respectively connected to the plurality of memory cells;
a plurality of first drivers for driving the plurality of first word lines selected during a read operation; and
a plurality of second drivers for driving the plurality of second word lines selected during a write operation, the second driver having a different drive capability from the plurality of first drivers,
wherein the drive capacity of the each of the plurality of second drivers is set on the basis of a time margin of the write operation of the semiconductor memory device.

9. A semiconductor memory device comprising:
a plurality of memory cells;
a plurality of bit lines respectively connected to the plurality of memory cells;
a plurality of first and second word lines respectively connected to the plurality of memory cells;
a plurality of first drivers for driving the plurality of first word lines selected during a read operation; and
a plurality of second drivers for driving the plurality of second word lines selected during a write operation, the second driver having a different drive capability from the plurality of first drivers,
wherein the memory cell is a memory cell of a 1-read 1-write static random access memory.

* * * * *